(12) United States Patent
Moreno et al.

(10) Patent No.: US 10,660,235 B2
(45) Date of Patent: May 19, 2020

(54) FAN WITH PIVOTABLE BLADES, AND CORRESPONDING ELECTRONICS COOLING SYSTEM AND METHODS

(71) Applicant: ARRIS Enterprises LLC, Suwanee, GA (US)

(72) Inventors: Luis Lopez Moreno, Apodaca (MX); Carlos Gonzalez Inda, Guadalupe (MX); Oswaldo Enrique Linares Rivas, Guadalupe (MX); Sergio Antonio Delon Canseco, Guadalupe (MX); Julio Cesar Ayala Vera, Apodaca (MX)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 16/163,492

(22) Filed: Oct. 17, 2018

(65) Prior Publication Data

US 2020/0128694 A1    Apr. 23, 2020

(51) Int. Cl.
*H05K 7/20* (2006.01)
*F28F 13/06* (2006.01)

(52) U.S. Cl.
CPC ......... *H05K 7/20172* (2013.01); *F28F 13/06* (2013.01); *F28F 2250/08* (2013.01); *H05K 7/2019* (2013.01); *H05K 7/20181* (2013.01)

(58) Field of Classification Search
CPC .. F28F 13/06; F28F 2250/08; H05K 7/20172; H05K 7/20181; H05K 7/2019
See application file for complete search history.

(56) References Cited

U.S. PATENT DOCUMENTS

| | | | |
|---|---|---|---|
| 3,580,694 A | 5/1971 | Andersen et al. | |
| 4,523,434 A | 6/1985 | Yoo et al. | |
| 5,226,783 A * | 7/1993 | Mita | F04D 29/384 416/223 R |
| 6,031,717 A | 2/2000 | Baddour et al. | |
| 6,135,875 A * | 10/2000 | French | H02B 1/565 361/695 |
| 6,174,232 B1 | 1/2001 | Stoll et al. | |
| 6,554,698 B2 * | 4/2003 | Kranzdorf | H05K 7/2019 137/849 |
| 6,587,340 B2 | 7/2003 | Grouell et al. | |

(Continued)

OTHER PUBLICATIONS

International Search Report and the Written Opinion of the International Searching Authority Re: Application No. PCT/US2019/056709 dated Jan. 23, 2020.

*Primary Examiner* — Jacob R Crum
(74) *Attorney, Agent, or Firm* — Chernoff, Vilhauer, McClung & Stenzel, LLP

(57) ABSTRACT

A fan (200) includes a housing (201) defining a duct (202). A spindle (203) can be concentrically located about a central axis within the duct. One or more fan blades (205,206,207) extending radially from the spindle toward a surface of the duct. Each fan blade is pivotable about a radial axis (208) between a closed position (400) where the each fan blade is in contact with each adjacent fan blade and an axially displaced open position (300) where the each fan blade is physically separated from the each adjacent fan blade. This prevents recirculation of air if a fan should fail.

12 Claims, 8 Drawing Sheets

(56) References Cited

U.S. PATENT DOCUMENTS

| | | | | |
|---|---|---|---|---|
| 7,484,925 B2 * | 2/2009 | Carlson | ............... | F04D 29/661 |
| | | | | 415/119 |
| D603,951 S * | 11/2009 | Seidler | .................. | D23/370 |
| 8,057,161 B2 | 11/2011 | Seidler | | |
| 8,668,435 B2 * | 3/2014 | Weisser | ............. | F04D 25/0613 |
| | | | | 415/146 |
| 10,294,947 B2 * | 5/2019 | Wei | .................. | F04D 25/14 |
| 2004/0086385 A1 | 5/2004 | Olesiewicz | | |
| 2004/0141288 A1 * | 7/2004 | Franz | ................ | F04D 29/366 |
| | | | | 361/695 |
| 2017/0328484 A1 * | 11/2017 | Czarnecki | ............. | F16K 15/00 |
| 2019/0301489 A1 * | 10/2019 | Chen | ................ | F04D 29/384 |

* cited by examiner

FAN WITH PIVOTABLE BLADES, AND CORRESPONDING ELECTRONICS COOLING SYSTEM AND METHODS

BACKGROUND

Technical Field

This disclosure relates generally to electronics cooling systems, and more particularly to forced air electronics cooling systems.

Background Art

The processing power available in modern integrated circuits is continually increasing. Frequently, this increase in processing power is accompanied by a decrease in physical device size. While this boost in power and reduction in size allows for more computing power, it also results in more heat generation. This heat must be removed for the devices to operate properly. This issue of excess heat generation is exacerbated when large numbers if integrated circuits and processors are densely populated in computer and server housings.

Illustrating by example, in server systems and other advanced computing platforms, large numbers of processors, memory devices, drivers, and other circuit components may be populated on printed circuit boards disposed within a chassis. When these components are all working simultaneously, they generate tremendous amounts of heat. This heat must be removed from the chassis to prevent the circuit components from overheating. Fans are traditionally used in chassis-based systems to remove heat so that electrical components within the chassis can function properly. When fans fail, components can fail. Accordingly, it would be advantageous to have improved cooling systems for such devices that allow components to continue operating even after one or more fans have failed.

Figure 1:
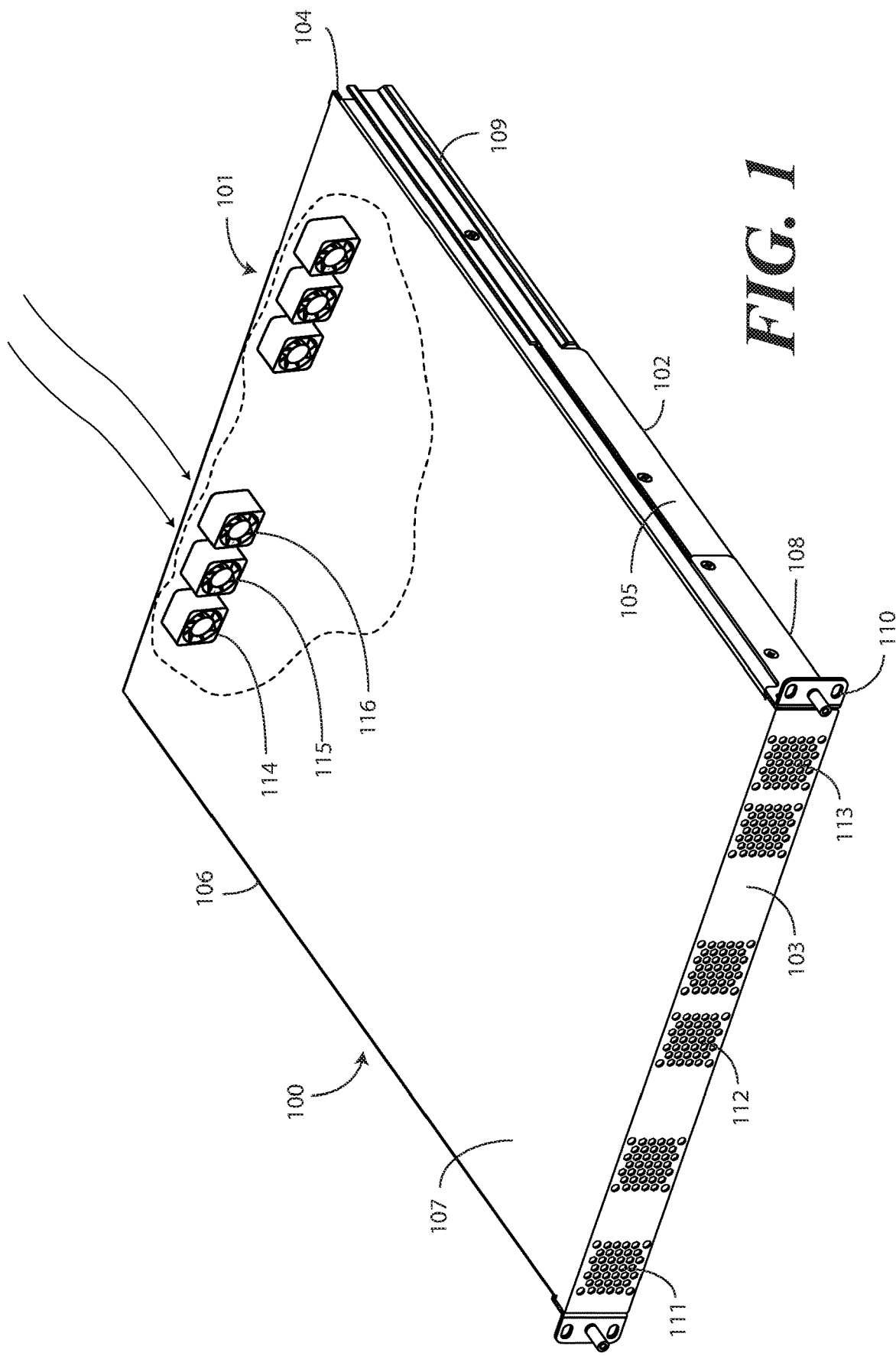
FIG. 1 illustrates a perspective view of one explanatory electronic device employing a cooling system in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. The term "substantially" is used to refer to alignments, measurements, dimensions, or other metrics inclusive of manufacturing tolerances. Accordingly, a "substantially orthogonal angle" with manufacturing tolerances of plus or minus two degrees would include angles between 88 and 92 degrees, inclusive. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide an improved fan that, when used in conjunction with other fans in a cooling system, works to prevent a "recirculation problem" that can occur when a fan in a fan bank fails. In forced air cooling systems for electronics devices, such as those housed in rack mounted chassis and in other housings, fans, air movers, blowers, or other devices are employed to draw air into, or remove air from, the housing of the device. These devices force warm air from inside the housing out, while drawing cooler air outside the housing in. They can be used in conjunction with convection systems such as heat sinks and other heat-radiating devices.

For electronic products where multiple fans are used in a "bank" to draw fresh air into the housing from its exterior to reduce the amount of heat within the housing, a common problem is observed when at least one of the fans fails. Said differently, when at least one of the fans stops rotating, for whatever reason, it ceases to draw fresh air into the housing from its exterior to reduce the amount of heat within the housing.

While this is a problem in and of itself due to the fact that the cumulative air moving power has been reduced, it can also compromise the operation of neighboring fans. When a fan fails, it effectively becomes a large hole in the side of the housing. In certain circumstances, neighboring fans can actually draw warm air out of the housing through the failed fan and then recirculate it back into the housing itself. Thus, instead of drawing fresh air into the housing from its exterior to reduce the amount of heat within the housing, when a fan fails, fans situated near the failed fan can actually push warm air into the housing instead of cool air. This issue, referred to herein as the "recirculation problem," can cause heat to build up within the housing of the electronic device, thereby causing temperatures therein to exceed the operating limits of the electrical components. This can lead to a number of problems, including a loss of efficiency, component malfunction, erroneous component operation, or even component failure.

Embodiments of the disclosure advantageously provide an air mover that prevents the recirculation problem. In one or more embodiments, an air mover is configured as a fan comprising a housing defining a duct. A spindle is concentrically located about a central axis within the duct. One or more fan blades extend radially from the spindle toward a surface of the duct. In one or more embodiments, each fan blade is pivotable about a radial axis between a closed position, where the each fan blade is in contact with each adjacent fan blade, and an axially displaced open position, where the each fan blade is physically separated from the each adjacent fan blade.

One or more actuators can be operable with each fan blade. In one or more embodiments, the actuators are operable to automatically transition the fan blades from the axially displaced open position to the closed position when the spindle of the fan stops rotating. Advantageously, this transition of the fan blades from the axially displaced open position to the closed position closes the "hole" in the housing that occurs when prior art fans fail. By closing this hole, fans situated adjacent to a failed fan continue to draw fresh air into the housing from its exterior to reduce the amount of heat within the housing, but do not draw warm air out of the housing through the failed fan. Thus, the recirculation problem is advantageously obviated.

Embodiments of the disclosure thus provide an improved fan with pivotable or rotatable fan blades. The fan blades pivot to the axially displaced open position when the fan is activated and operational, i.e., when the spindle is rotating about its central axis. Where the fan blades are in the axially displaced open position, each fan blade draws air through the duct when the spindle rotates.

When the fan fails, however, for whatever reason, thus causing the spindle to stop rotating about its central axis, in one or more embodiments the fans automatically transition from the axially displaced open position to the closed position. When in the closed position, the fan blades block the passage of air through the duct, thereby preventing the recirculation problem.

Embodiments of the disclosure offer numerous benefits over the prior art. As noted above, the automatic transition of the fan blades from the axially displaced open position to the closed position prevents the recirculation problem. It should be noted that this prevention of the recirculation problem is offered by the fan itself, which is attachable to prior art couplings. This means that no additional accessories, external or otherwise, are necessary to prevent air from passing through the duct of a failed fan.

Embodiments of the disclosure also advantageously improve the reliability and overall efficiency of the electronic components disposed within the housing to which the fan is attached. This benefit stems from the fact that fans adjacent to a failed fan continue to draw fresh air into the housing from its exterior to reduce the amount of heat within the housing, but do not draw warm air out of the housing through the failed fan. This advantageously reduces the risk of failure of components disposed within the housing due to excessive heat. Moreover, embodiments of the disclosure are suitable for use on a wide variety of electronic devices, including rack mount chassis devices.

Embodiments of the disclosure also provide numerous advantages over prior art designs. Illustrating by example, U.S. Pat. No. 8,057,161 to Seidler teaches a fan structure that is suitable for rack-mounting adjacent to heat-generating electrical equipment. The fan structure features a noise-damping outflow baffle containing a plurality of non-return flaps. Each non-return flap serves to prevent the reverse flow of air when fan activity is interrupted. The baffle can include four generally sickle-shaped flaps. Each flap is connected along a straight edge thereof by a pair of elastomeric hinge connections to a surrounding frame. The hinge connections urge the flaps to close whenever they are not forced by airflow into an open orientation. The axes of rotation of the flaps are chosen to keep them from jamming against one another. Since the flaps act as vanes, tending to straighten out an originally helical flow of air induced by the fan, they minimize the pressure drop which has therefore been associated with outflow baffles. The use or elastomers at critical points in the structure reduce noise and clatter.

Embodiments of the present disclosure differ from the '161 patent by providing a spindle having one or more fan blades extending radially from the spindle toward a duct surface. Each fan blade is pivotable so as to provide check valve functionality. In contrast to the '161 patent, which requires an external component to be mounted to a fan, embodiments of the disclosure require no such external component. Embodiments of the present disclosure allow fan blades to rotate between an axially displaced open position and a closed position as a function of whether the fan is in an ON (spindle rotating) or OFF (spindle not rotating) state. Additionally, embodiments of the disclosure can include a counter weight feature or other actuator to automatically transition the fan blades from the axially displaced open position to the closed position when the spindle stops, none of which is taught by the '161 patent.

U.S. Pat. No. 6,031,711 to Baddour et al. teaches a plurality of parallel fans mounted so as to move side-by-side columns of air in a chassis. A louver member is provided adjacent each fan. Each louver member is bendable from a closed position to an open position by a flow of air generated by its respective fan, and is restrictedly bendable to a closed position, in engagement with a portion of an air passageway, in response to failure of its respective fan.

Embodiments of the disclosure differ from the '711 patent by allowing fan blades to pivot axially along an outer surface of a spindle between an axially displaced open position, where airflow is permitted, and a closed position, where airflow is blocked. Unlike the extra louvers required by the '711 patent, embodiments of the disclosure require no extra components to be attached to a fan. In contrast to the '711 patent, fan blades configured in accordance with embodiments of the disclosure have the ability to rotate between an axially displaced open position and a closed position depending upon whether the fan is in ON or OFF state. Additionally, embodiments of the disclosure can include a counter weight feature or other actuator to automatically transition the fan blades from the axially displaced open position to the closed position when the spindle stops, none of which is taught by the '711 patent.

U.S. Pat. No. 6,174,232 to Stoll et al. teaches a plastic film, attached to a fan, and having an outer edge and a central region. The plastic film serves as a check valve for the fan. The check valve also has a number of slits that define flaps in the film. The flaps are symmetrically arrayed in a spiral-like pattern between the central region and the outer edge. The plastic film mounts to the outer surface of a tube axial fan. Under normal operating conditions, the fan moves a helical flow of air in a generally axial direction through the valve. The flaps are blown open and align with the oncoming flow at low angles of attack to minimize dynamic losses. The flaps are in the closed position and lie flush on the outer surface of the exhaust plate mounted on the fan at all other times to prevent airflow back through the fan in the opposite direction once the fan has failed.

Embodiments of the disclosure differ from the '232 patent in that it is the fan blades of the present disclosure that allow or block airflow, not an external component. With embodiments of the disclosure, no external components are required to be attached. The fan blades of the present disclosure have the ability to rotate axially about a spindle between an axially displaced open position and a closed position depending upon whether the fan is in ON or OFF state. Additionally, embodiments of the disclosure can include a counter weight feature or other actuator to automatically transition the fan blades from the axially displaced open position to the closed position when the spindle stops, none of which is taught by the '232 patent.

U.S. Pat. No. 6,587,340 to Grouell et al. teaches a method and apparatus for maintaining cooling efficiency during air mover failure. An electrical enclosure may include a heat-generating thermal load, multiple air movers configured to remove heat from the thermal load, and a backward-airflow reducing device configured as flaps coupled to the exterior of a fan. These flaps reduce the amount of air that can be drawn backwards through one of the air movers if that air mover fails. The flaps are blown open while the air mover if functioning. Gravity closes the flaps when the air mover is not functioning.

As with the other patents described above, embodiments of the disclosure differ from the '340 patent in that it is the fan blades of the present disclosure that allow or block airflow, not an external component. With embodiments of the disclosure, no external components are required to be attached. The fan blades of the present disclosure have the ability to rotate axially about a spindle between an axially displaced open position and a closed position depending upon whether the fan is in ON or OFF state. Additionally, embodiments of the disclosure can include a counter weight feature or other actuator to automatically transition the fan blades from the axially displaced open position to the closed position when the spindle stops, none of which is taught by the '340 patent.

Turning now to FIG. 1, illustrated therein is one explanatory electronic device 100 employing an electronics cooling system 101 in accordance with one or more embodiments of the disclosure. As shown in FIG. 1, the electronic device 100 includes a housing 102. In this illustrative embodiment, the housing 102 is configured as a 1RU chassis. The housing 102 includes a front face 103, a rear face 104, a first sidewall 105, a second sidewall 106, a top surface 107, and a bottom surface 108. In this illustrative embodiment, one or more rack mounts 109,110 are coupled to the housing 102 so that the housing 102 can be coupled to a rack. In one embodiment, the housing 102 is configured for coupling to a standard nineteen-inch equipment rack.

In one or more embodiments, the front face 103 defines one or more air exhausts 111,112,113. The number and placement of the air exhausts 111,112,113 can vary based upon application. Similarly, in one or more embodiments, the rear face 104 comprises one or more fans 114,115,116 that serve as forced air inlets into the housing 102. The number and placement of the fans 114,115,116 can also vary based upon application. In one or more embodiments, the one or more fans 114,115,116 draw fresh air into the housing 102 from its exterior to reduce the amount of heat within the housing 102. This causes warm air from the interior of the housing 102 to be expelled through the air exhausts 111, 112,113.

In one or more embodiments, electrical components can be positioned within the housing 102. For example, circuit cards can be inserted into, or removed from, the housing 102, optionally through the front face 103. In one or more embodiments, each circuit card includes electrical traces, ground planes, and so forth, each of which can serve as a heat sink for the electrical components coupled to the circuit cards. The circuit cards can be arranged horizontally or vertically within the housing 102.

In one or more embodiments, the one or more fans 114,115,116 can be configured as an array by placing the fans 114,115,116 side by side. The fans 114,115,116 can be manufactured individually or as a unitary component. For example, in one embodiment a fan module includes three fans manufactured together as a single assembly that can be selectively attached to, or detached from, the rear face 104. If one or more fans fail, a technician can simply remove the bank of fans defining the fan module and replace it with a new fan module. In other embodiments, the fans can be individually replaced upon failure.

In one or more embodiments each fan can pull about 23 cubic feet per minute, assuming a 50 degrees centigrade operating temperature at 10,000 feet above sea level. With larger fans, this capacity can be increased to as much as 75 cubic feet per minute under similar conditions. The power of these fans illustrates the extent to which the recirculation problem can occur when a fan fails.

In one or more embodiments, the one or more fans 114,115,116 are each operable to draw air into the housing 102 through ducts in each fan 114,115,116. In one embodiment, this occurs along a first direction, which is down and to the left as viewed in FIG. 1. This air passes across circuit cards and electrical components and is then pushed out of the housing 102 through the one or more exhausts 111,112, 113.

Figure 2:
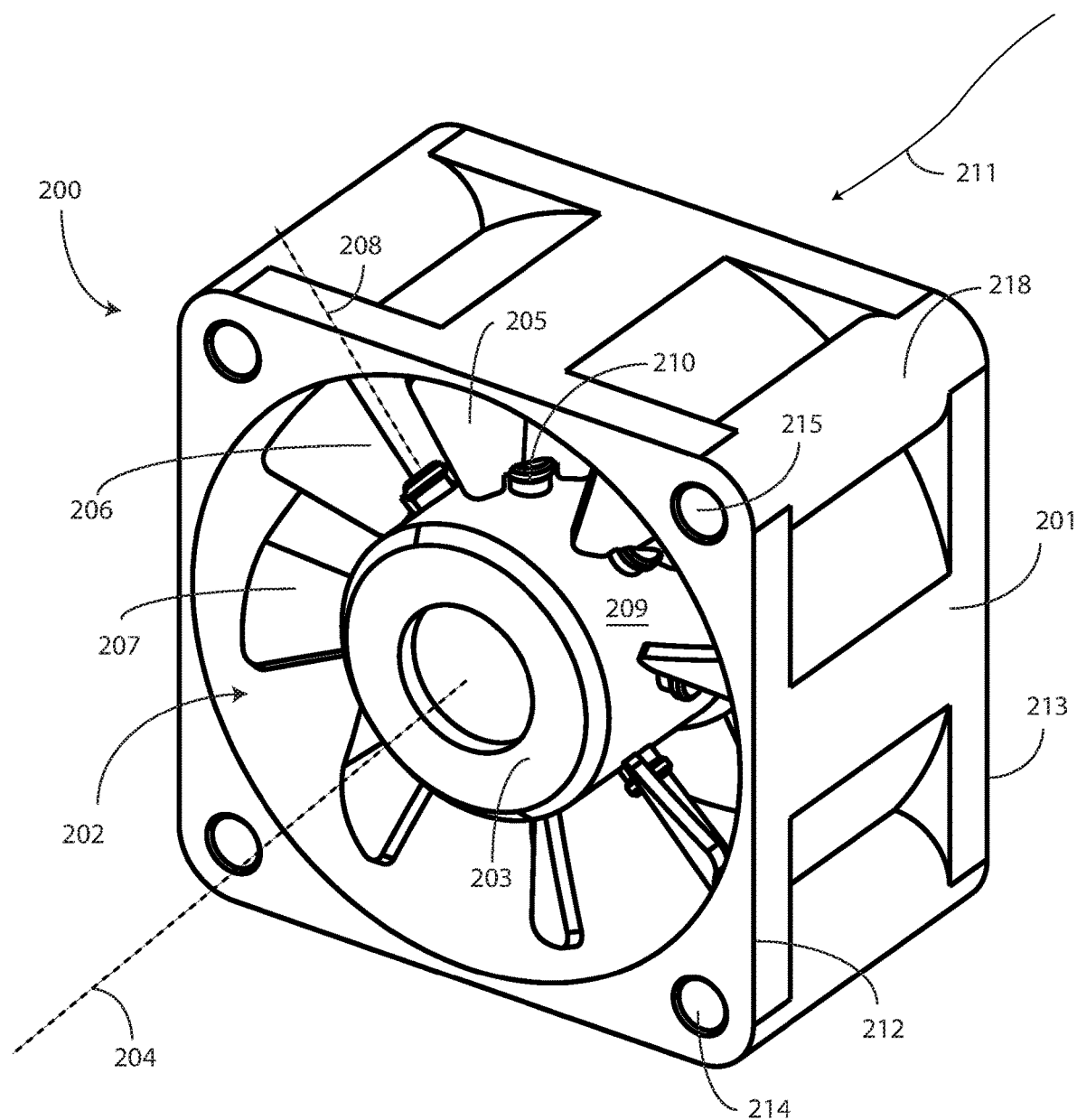
FIG. 2 illustrates one explanatory fan in accordance with one or more embodiments of the disclosure.

Turning now to FIG. 2, illustrated therein is one explanatory fan 200 configured in accordance with one or more embodiments of the disclosure. In this illustrative embodiment, the fan 200 includes a housing 201 defining a duct 202. In this illustrative embodiment, the housing 201 has a rectangular cross section, while the duct 202 is cylindrical. While the fan 200 of FIG. 2 provides one example of an air mover for simplicity of illustration, it will be clear to those of ordinary skill in the art having the benefit of this disclosure that the fan 200 could be configured in other configurations as well. For example, while the housing 201 of FIG. 2 has a generally square cross section, other fan assemblies having rectangular, circular, elliptical, or other cross sectional shapes could equally be used with embodiments of the disclosure. In most embodiments, the duct 202 will be cylindrical for symmetry.

In one or more embodiments, a spindle 203 is concentrically located about a central axis 204 within the duct 202. In this illustrative embodiment, the spindle 203 is cylindrical. However, the spindle can take other shapes in other applications. When the fan is operational, the spindle 203 rotates about the central axis 204 within the duct. When the fan is non-operational or malfunctions, the spindle 203 ceases to rotate about the central axis 204 within the duct. One or more fan blades 205,206,207 extend radially from an outer surface 209 of the spindle 203.

The housing 201, spindle 203, and fan blades 205,206,207 can be manufactured from a variety of materials. Illustrating by example, in one embodiment each of the housing 201, spindle 203, and fan blades 205,206,207 is manufactured from polycarbonate plastic resin via an injection molding process. Other thermoplastic materials may also be used, such as acrylonitrile butadiene styrene (ABS), polycarbonate, and polycarbonate-ABS due to their durability. Other equivalents, such as styrene for example, may be substituted. In other embodiments, the housing 201, spindle 203, and fan blades 205,206,207 can be manufactured of metal, such as spring steel, stainless steel, or other materials. Each of the housing 201, spindle 203, and fan blades 205,206,207 can be manufactured from a common material in one embodiment. In other embodiments, the housing 201, spindle 203, and fan blades 205,206,207 can be manufactured from different materials. For example, the housing 201 might be metal while the spindle 203 and fan blades 205, 206,207 are plastic, and so forth.

In one or more embodiments, a motor (not shown) disposed within the housing 201 to turn the spindle 203. The spindle 203 turns in response to the motor and draws air 211 through the duct 202. The motor is powered, in one embodiment, by a wire buss terminating at an electrical connector extending from the housing 201. In one embodiment the electrical connector is coupled to a sidewall of the housing 201, for example. The electrical connector can include a latching connector to couple to a complementary latching connector coupled to a power source. The housing 201 of FIG. 2 terminates at one or more edges, e.g., edges 212 and 213. In one embodiment, these edges 212,213 are substantially orthogonal corners of the housing 201.

In one embodiment, one or more apertures 214,215 can pass through the housing 201. Screws or bolts can be placed through the apertures 214,215 to bolt the fan 200 to a conventional chassis along the sidewalls. In one embodiment, one or more recesses, e.g., recesses 216,217, can be disposed about bosses, e.g., boss 218, through which the apertures, e.g., aperture 215, pass. The recesses 216,217 not only save material in the housing 201, but make the fan assembly easier to hold as well.

In one or more embodiments, the one or more fan blades 205,206,207 are coupled to the spindle 203 by a rotary mechanism 210 such that each fan blade is axially pivotable about a radial axis 208 extending from the spindle 203 between a closed position, where each fan blade 205,206, 207 is in contact with fan blades adjacent thereto, and an axially displaced open position where each fan blade 205, 206,207 is physically separated from fan blades adjacent thereto.

The rotary mechanism 210 can take a variety of forms. In one embodiment, the rotary mechanism 210 is configured as a rod that inserts into an aperture in the outer surface 209 of the spindle 203 to allow the fan blades 205,206,207 to pivot about a radial axis 208 extending from the spindle 203. Such an embodiment will be illustrated in more detail with reference to FIG. 5 below.

In another embodiment, the rotary mechanism 210 is a bearing component coupled to a shaft at the base of each fan blade 205,206,207 that allows the shaft to rotate. In still another embodiment, the rotary mechanism 210 is configured as a cam about which the fan blades 205,206,207 rotate. In still another embodiment, the outer surface 209 of the spindle 203 comprises a plurality of male bosses, while the base of each fan blade 205,206,207 comprises a female receiver. The female receiver can situate atop its corresponding male boss and rotate to allow the fan blades 205,206,207 to pivot. These examples of rotary mechanisms are illustrative only, as numerous others will be obvious to those of ordinary skill in the art having the benefit of this disclosure.

Figure 3:
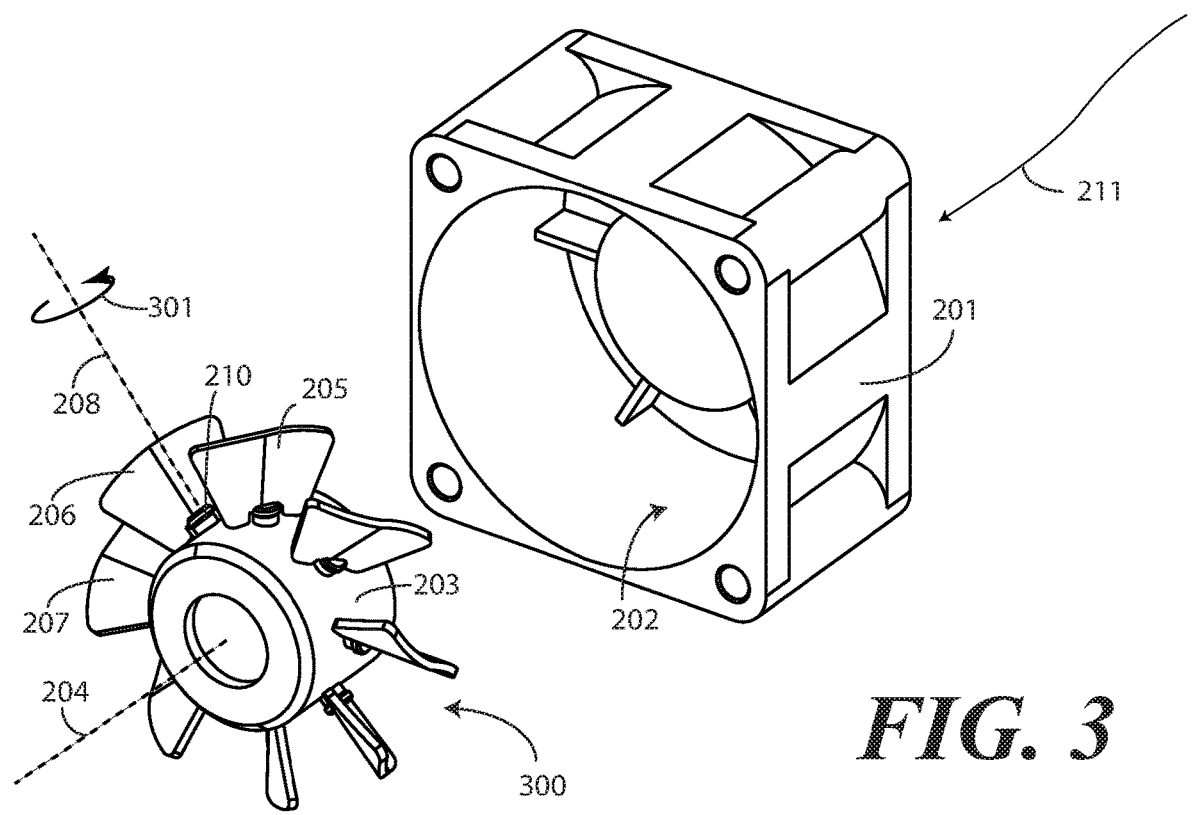
FIG. 3 illustrates an exploded view of one explanatory fan in accordance with one or more embodiments of the disclosure, where each fan blade is pivoted to an axially displaced open position where each blade is physically separated from each adjacent blade.

Turning briefly to FIG. 3, illustrated therein is the spindle 203 removed from the housing 201. In FIG. 3, each fan blade 205,206,207 is pivoted about its corresponding rotary mechanism 210 to the axially displaced open position 300. Accordingly, each fan blade 205,206,207 is physically separated from fan blades to which it is adjacent.

Illustrating by example, fan blade 206 is physically separated from fan blade 205 and fan blade 207 due to its axial rotation 301 about its radial axis 208, combined with each other fan blade 205,207 being rotated in a similar manner. In one or more embodiments, this axial rotation 301 about the radial axis 208 is between thirty and sixty degrees. In one embodiment, this axial rotation 301 about the radial axis 208 is about forty-five degrees. Other amounts of axial rotation 301 about the radial axis 208 will be obvious to those of ordinary skill in the art. When the fan blades 205,206,207 are in the axially displaced open position 300, the fan blades 205,206,207 are operable to draw air 302 through the duct 202 when the spindle 203 rotates about the central axis 204.

Figure 4:
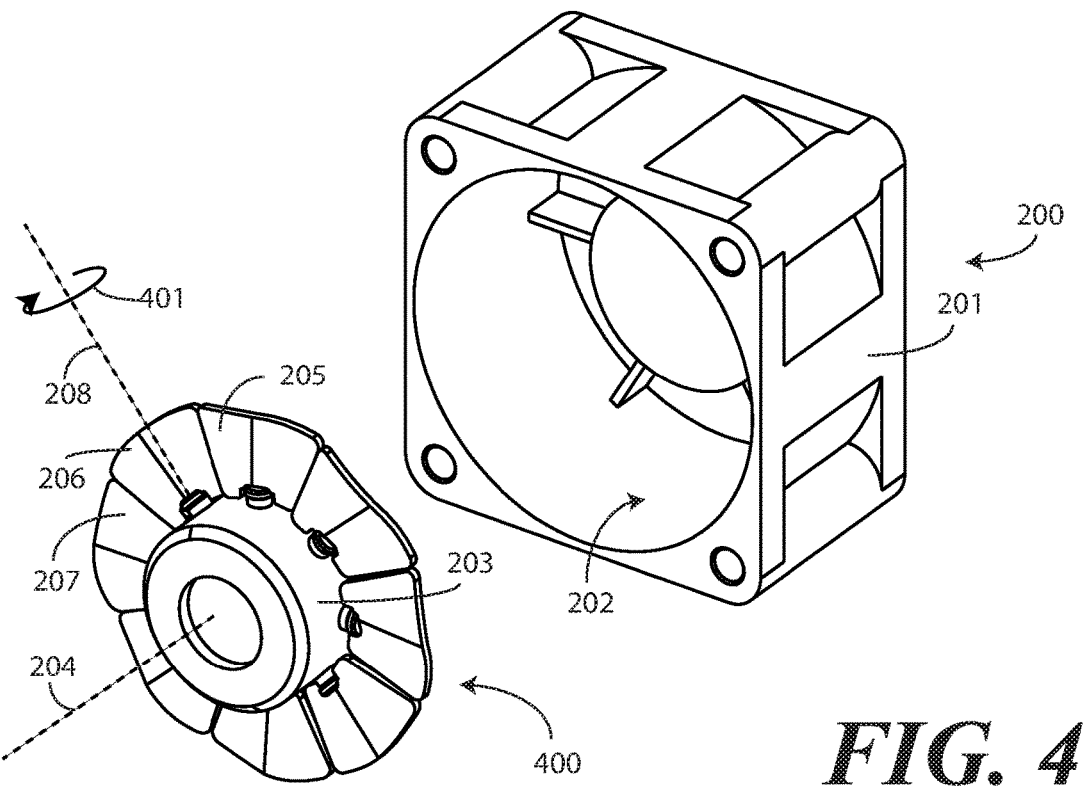
FIG. 4 illustrates another exploded view of one explanatory fan in accordance with one or more embodiments of the disclosure, where each fan blade is pivoted to a closed position where each fan blade is in contact with each adjacent fan blade.

By contrast, turning now to FIG. 4, illustrated therein is the spindle 203 again removed from the housing 201. In FIG. 4, each fan blade 205,206,207 is pivoted about its corresponding rotary mechanism 210 from the axially displaced open position (300) to the closed position 400. Accordingly, each fan blade 205,206,207 is in contact with fan blades to which it is adjacent.

Illustrating by example, fan blade 206 abuts, at its edge, the edge of fan blade 205. Fan blade 206 also abuts, at its other edge, an edge of fan blade 207 due to its reverse axial rotation 401 about its radial axis 208, combined with each other fan blade 205,207 being rotated in a similar manner. When the fan blades 205,206,207 are in the closed position 400, the fan blades 205,206,207 restrict and/or preclude airflow through the duct 202, regardless of whether the spindle 203 rotates about the central axis 204.

In one or more embodiments, the fan blades 205,206,207 are in the closed position 400 whenever the spindle 203 stops rotating. Illustrating by example, if the fan 200 were to fail, which would cause the spindle 203 to stop rotating, in one or more embodiments the fan blades 205,206,207 are configured to transition to the closed position 400. Similarly, if the fan 200 is switched OFF, in one or more embodiments the fan blades 205,206,207 are configured to transition to the closed position 400. When in the closed position, the fan blades 205,206,207 are aligned so as to abut at least a portion of each adjacent fan blade with now free space between adjacent fan blades, e.g., between fan blade 205 and fan blade 206. This orientation precludes, or at a minimum severely restricts, air from flowing through the duct 202 when the fan blades 205,206,207 transition to the closed position 400.

By contrast, turning now back to FIG. 3, the fan blades 205,206,207 will be in the axially displaced open position 300 when the spindle 203 begins to rotate about the central axis 204. When in the axially displaced open position 300, free space is created between each fan blade, e.g., fan blade 205 and fan blade 206. This physical space between the fan blades 205,206,207, combined with the angular orientation of the fan blades 205,206,207 relative to a plane defined by the front face of the spindle 203, draws air 211 through the duct 202 when the spindle 203 rotates.

In one or more embodiments, an actuator automatically causes rotation of the fan blades 205,206,207 between the axially displaced open position 300 and the closed position (400). The actuator, like the rotary mechanism 210, can take many forms. Some illustrative actuators will be described below with reference to FIGS. 5-6. Others will be obvious to those of ordinary skill in the art having the benefit of this disclosure.

In one embodiment, the actuator comprises a linking mechanism between the spindle 203 and the fan blades 205,206,207. The actuator, in one or more embodiments, can give the fan blades 205,206,207 the ability to rotate 301 about their radial axes 208 proportionally to the angular speed of the spindle 203. For example, in one or more embodiments where the spindle 203 exceeds a predefined rotational velocity about the central axis 204, the fan blades 205,206,207 will pivot to the axially displaced open position 300. By contrast, when the rotation of the spindle 203 falls below the predefined rotational velocity, the fan blades 205,206,207 will automatically transition from the axially displaced open position 300 to the closed position (400).

Figure 5:
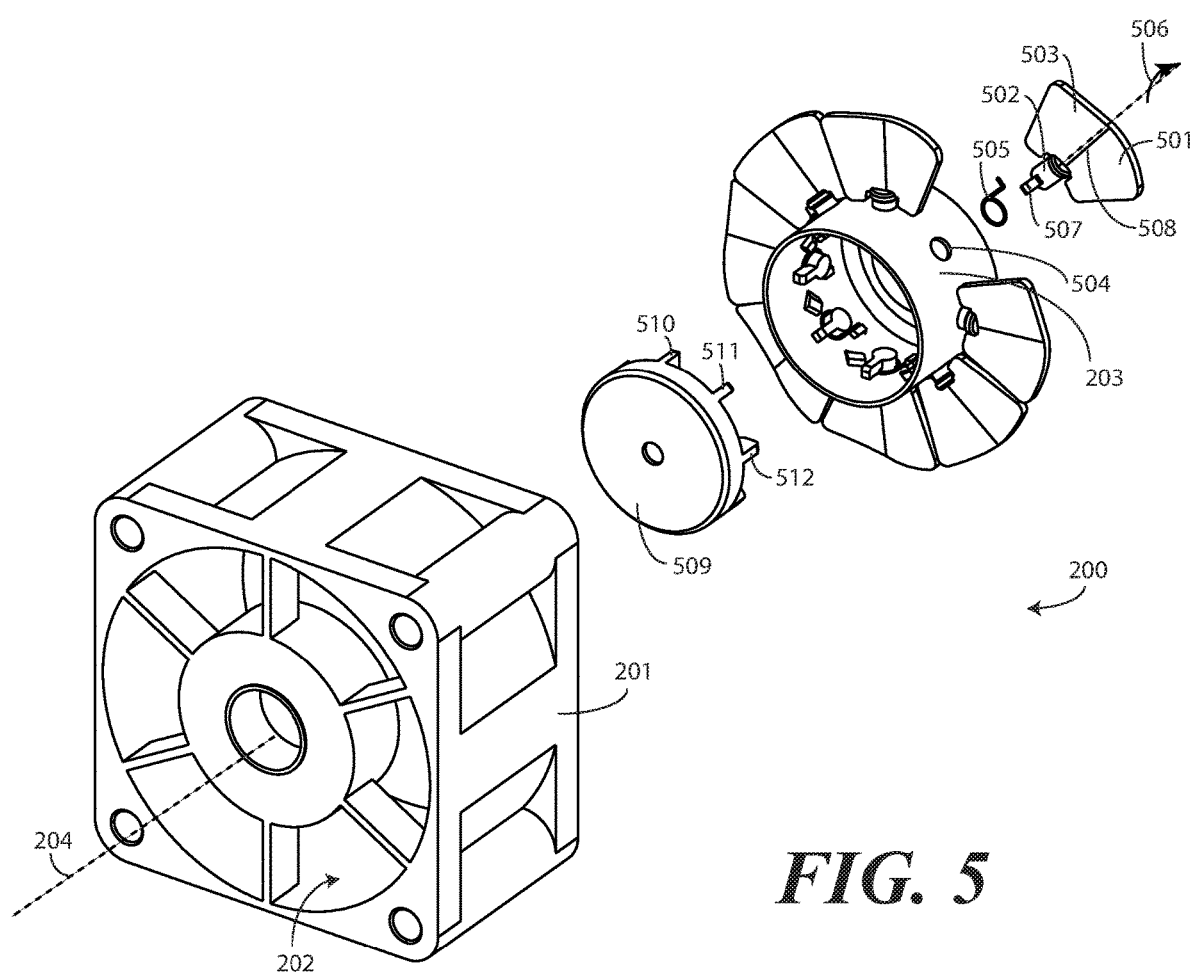
FIG. 5 illustrates an exploded view of one explanatory fan in accordance with one or more embodiments of the disclosure.

Turning now to FIG. 5, illustrated therein is one such actuator. In the illustrative embodiment of FIG. 5, a fan blade 501 has been removed from the spindle 203 such that the components of the fan blade 501, including those coupling the fan blade 501 to the spindle 203, can be more readily seen.

In this embodiment, each fan blade 501 comprises a shaft 502 and a paddle 503. In this illustrative embodiment, the paddle 503 is a non-planar paddle and includes a bisecting bend 508 of between fifteen and thirty degrees between a first paddle portion and a second paddle portion. The bisecting bend 508 can optionally be included to help the paddle 503 draw air through the duct 202 when the spindle 203 rotates. Regardless of whether the bisecting bend 508 is included, the paddle 503 serves as the air-forcing component that causes air to be drawn through the duct 202 of the housing 201 when the spindle 203 rotates about the central axis 204.

In one or more embodiments, the shaft 502 extends through an aperture 504 disposed along the outer surface 209 of the spindle 203. The shaft 502, inserted into the aperture 504, in one or more embodiments defines the rotary mechanism (210) allowing the fan blade 501 to be axially pivotable about a radial axis extending from the spindle 203 between a closed position, where the fan blade 501 is in contact with fan blades adjacent thereto, and an axially displaced open position where the fan blade is physically separated from fan blades adjacent thereto.

In this illustrative embodiment, each fan blade 501 includes a spring. In this illustrative embodiment, the spring 505 is configured as a coiled spring, and is positioned about the shaft 502, biasing the paddle 503 toward the closed position (400). The spring 505 of this embodiment serves as an actuator to automatically transition the fan blade 501 from the axially displaced open position (300) to the closed position (400) when the spindle 203 stops rotating. In this illustrative embodiment, the spring 505 applies a loading force 506 on the fan blade 501 to bias the fan blade 501 toward the closed position (400).

In the absence of any other forces on the components of the fan blade 501, the spring 505, therefore, will cause the fan blade 501 to automatically rotate axially to a default state, which is the closed position (400) in one or more embodiments. Where all fan blades of the fan 200 are similarly configured, in the default state and without other forces, each fan blade 501 rotates to the closed position (400). Thus, as the spring 505 applies the loading force 506 about the shaft 502 of the fan blade 501, the spring 505 serve as an actuator to automatically transition the fan blade 501 from the axially displaced open position (300) to the closed position (400) when the spindle 203 stops rotating about the central axis 204.

The fan blade 501 can be transitioned from the closed position (400) to the axially displaced open position (300) in a variety of ways. Since the spring 505 applies the loading force 506 about the shaft 502 of the fan blade 501 biasing the fan blade 501 to the closed position (400), a force exceeding the spring coefficient of the spring 505 must be applied to the fan blade 501 to overcome the spring force and move the fan blade 501 from the closed position (400) to the axially displaced open position (300).

In this illustrative embodiment, each fan blade 501 also includes a lever 507. In this illustrative embodiment, the lever 507 is coupled to the shaft 502 at a location opposite the paddle 503. Said differently, in this illustrative embodiment the shaft 502 is positioned between the lever 507 and the paddle 503.

In one or more embodiments, to apply a force overcoming the spring force, each lever 507 is weighted so as to define a weighted lever. In one or more embodiments, the weight of the weighted lever provides substantially more inertia to applied forces than does the shaft 502 and/or paddle 503. Where this is the case, axial rotation of the spindle 203 about the central axis 204 due to an accelerative force causes the lever 507 to resist this rotation by way of inertia. The inertia of the lever 507 causes the fan blade 501 to pivot, thereby applying a force exceeding the spring coefficient of the spring 505 to transition the fan blade 501 from the closed position (400) to the axially displaced open position (300). In such an embodiment, since inertia is the actuator, inertia of the weighted lever transitions the fan blade 501 from the closed position (400) to the axially displaced open position (300) when the spindle 203 exceeds a predefined rotational velocity due to an applied accelerative force. When the spindle 203 is below this predefined rotational velocity, the spring coefficient of the spring 505 will overcome the inertia and transition the fan blade 501 from the axially displaced open position (300) to the closed position (400).

In this illustrative embodiment, however, the lever 507 is not weighted. As such, inertia is not used as the actuator. Instead, a driver 509 is coupled to the spindle 203. In this illustrative embodiment, the driver 509 is concentrically located within the spindle 203. The spindle 203 is allowed to move, or "free wheel," about the driver 509. As shown in FIG. 5, in one or more embodiments, the driver 509 comprises one or more actuation arms 510,511,512 extending distally from a major face of the driver 509.

Figure 6:
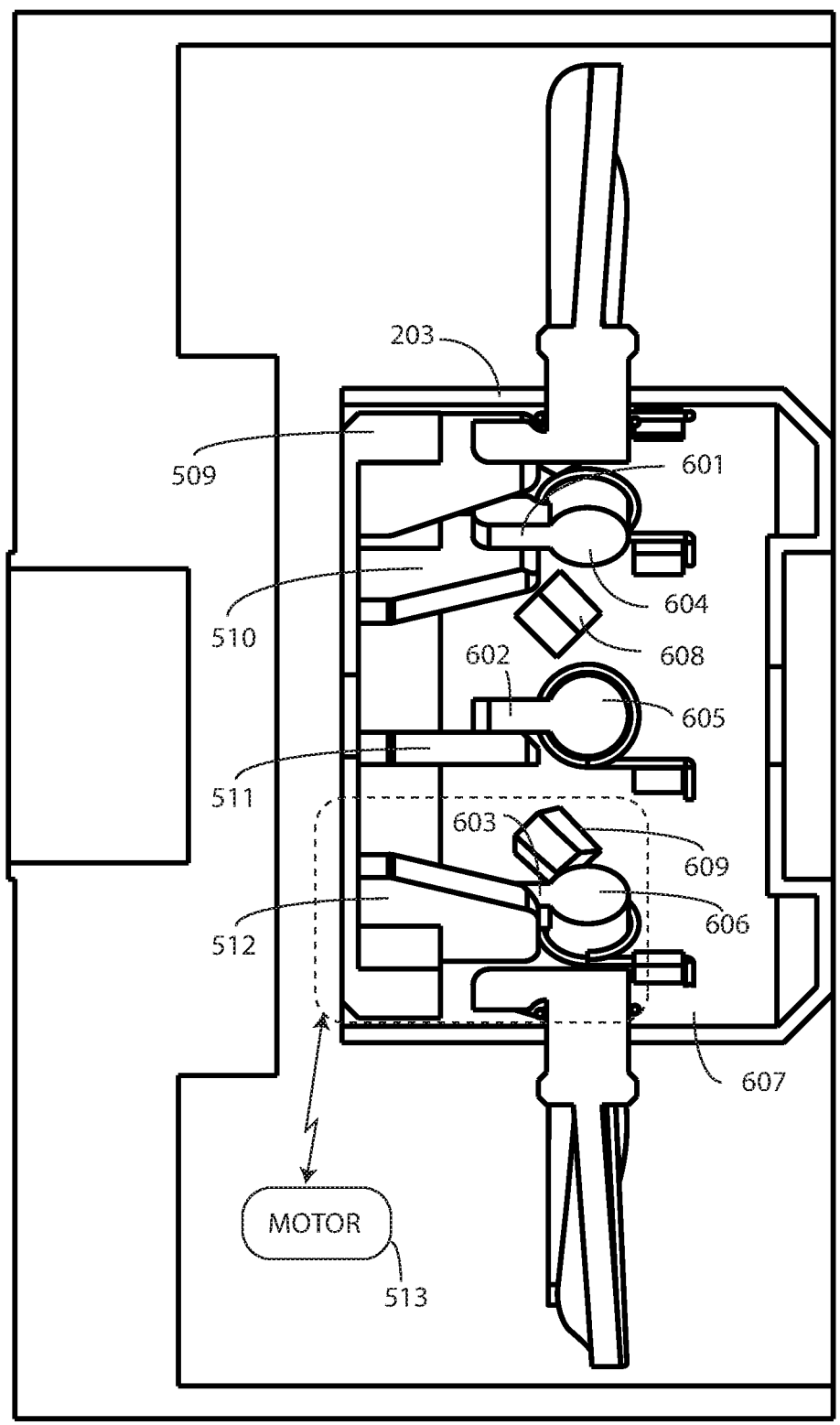
FIG. 6 illustrates a sectional view of one explanatory fan in accordance with one or more embodiments of the disclosure.

Turning briefly to FIG. 6, in one or more embodiments when the driver 509 is inserted to the spindle 203 and begins to rotate about the central axis 204, the actuation arms 510,511,512 engage the levers 601,602,603. In one or more embodiments, this engagement occurs when major faces of the actuation arms 510,511,512 abut or otherwise seat or become adjacent to major faces of the levers 601,602,603.

As the driver 509 continues rotates, propelled by an accelerative force, the actuation arms 510,511,512 apply a loading force to the levers 601,602,603. As this loading force increases, the actuation arms 510,511,512 begin to radially displace the corresponding levers 601,602,603. When the force applied to the levers 601,602,603 by the actuation arms 510,511,512 is sufficient to overcome the spring coefficient of the spring 505, this causes the shaft 604,605,606 coupled to each lever 601,602,603 to pivot, thereby transitioning the corresponding paddle from the closed position (400) to the axially displaced open position (300).

In this illustrative embodiment, the interior surface 607 of the spindle 203 has one or more ribs 608,609 extending distally into the interior of the spindle 203. In one or more embodiments, the ribs 608,609 function to limit the radial displacement of the levers 601,602,603 caused by the actuation arms 510,511,512. When the levers 601,602,603 contact the ribs 608,609, the spindle 203 begins to rotate.

In one or more embodiments, the force applied to the levers 601,602,603 by the actuation arms 510,511,512 is proportional to the torque applied by the driver 509. As such, the radial displacement of the levers 601,602,603 caused by the actuation arms 510,511,512 continues as the rotational velocity of the driver 509 increases. In one or more embodiments, at a predefined rotational velocity, the force applied to the levers 601,602,603 by the actuation arms 510,511,512 will be sufficient to cause each lever 601,602,603 to hit a corresponding rib 608,609, thereby stopping the radial displacement of each shaft 604,605,606. In one or more embodiments, the radial displacement of each lever 601, 602,603, and thus each shaft 604,605,606, is limited to about forty-five degrees about the radial axis of each shaft 604, 605,606 as it extends from the outer surface (209) of the spindle 203. When this occurs, the spindle 203 will start to rotate as well.

In one or more embodiments, as long as the rotational velocity of the driver 509 is above the predefined rotational velocity, the paddles coupled to the shafts 604,605,606 will remain in the axially displaced open position (300). However, when the rotational velocity of the driver 509 falls below this predefined rotational velocity, the spring coefficient of the springs (505) will overcome the force applied by the driver to cause the paddles coupled to the shafts 604, 605,606 to transition from the axially displaced open position (300) to the closed position (400).

Either of the inertial system or the actuator/lever system of FIGS. 5-6 can be used to automatically transition each fan blade between the axially displaced open position (300) and the closed position (400), transitioning to the latter when the spindle 203 stops rotating. While these inertial systems and the actuator/lever system of FIGS. 5-6 can be used to automatically transition the fan blades from the closed position (400) to the axially displaced open position (300), other techniques for doing the same can be used as well. Illustrating by example, in another embodiment the lever/actuator system of FIG. 6 could be replaced by a small motor 513 that is operable to automatically transitions the fan blades between the axially displaced open position (300) and the closed position (400). Still other techniques will be obvious to those of ordinary skill in the art having the benefit of this disclosure.

Regardless of the type of actuator used, the actuator serves to provide a self-triggered or automatic response that can be used in situations where a fan fails. Embodiments of the disclosure contemplate that when a fan fails, its spindle will cease rotating. Accordingly, the actuators used herein work to automatically transition the fan blades to the closed position (400) whenever a failure occurs. This situation is illustrated in FIGS. 7-8 below.

Figure 7:
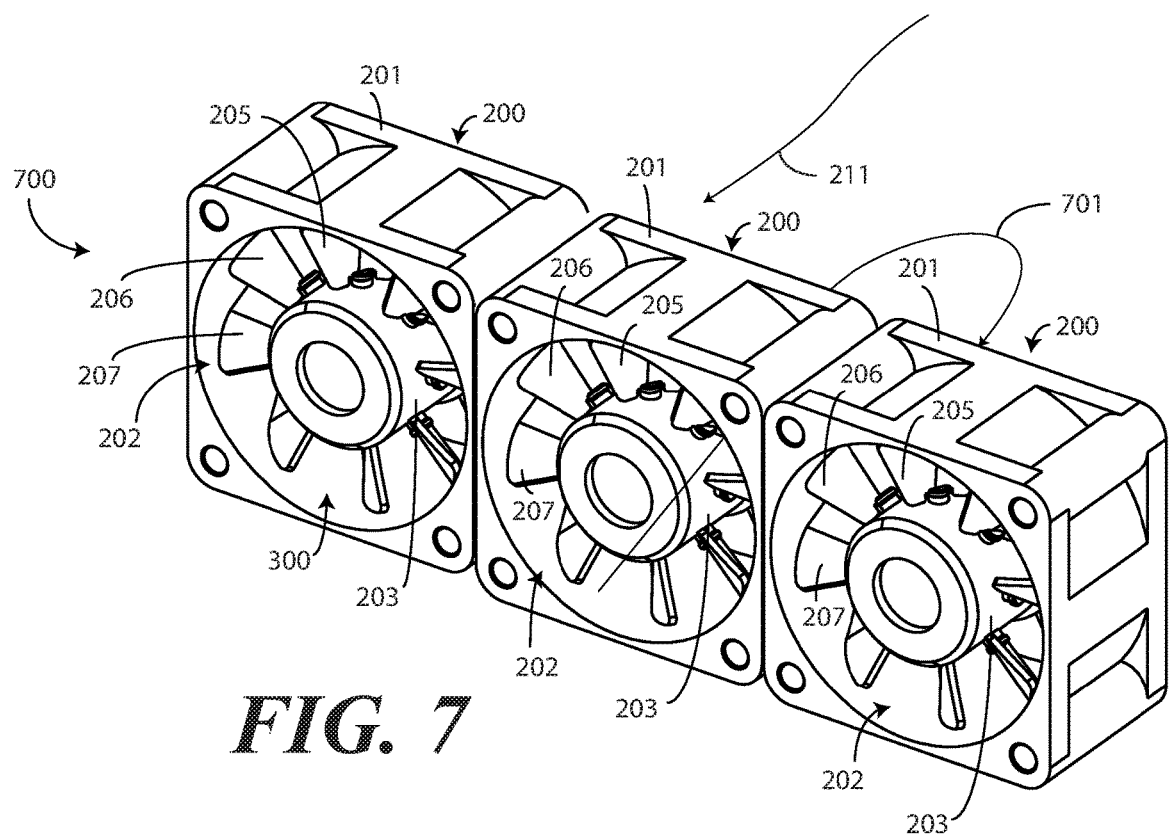
FIG. 7 illustrates one explanatory fan system in accordance with one or more embodiments of the disclosure.
Figure 8:
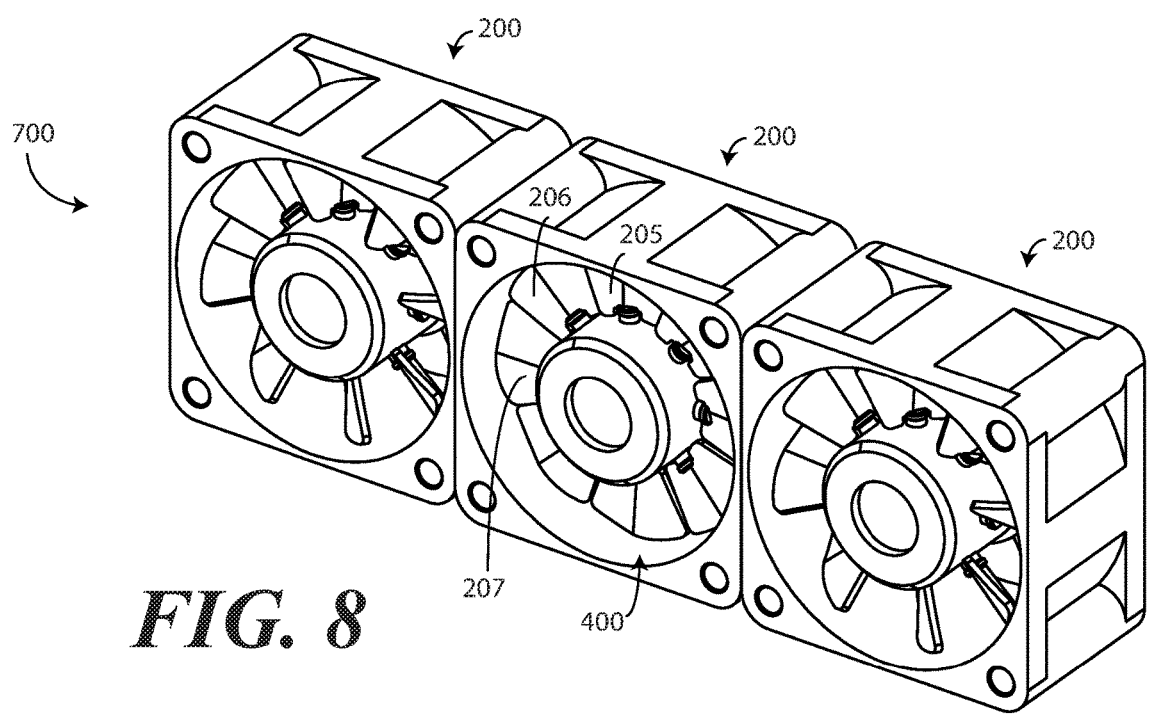
FIG. 8 illustrates one explanatory fan system in accordance with one or more embodiments of the disclosure, where one fan has failed.

Turning first to FIG. 7, illustrated therein is a bank 700 of fans 200. While this illustrative bank 700 includes three fans 200, it could include fewer than three or more than three fans as well. In this illustrative embodiment, each of the fans 200 in the bank 700 is disposed adjacent to the next. In practice, there may be some separation between the fans 200 in the bank 700. The bank 700 can be manufactured as a single unit in one embodiment, so that failure of any one fan would mean replacing the entire bank 700. In other embodiments, individual fans 200 of the bank 700 may be replaceable without replacing adjacent fans.

In FIG. 7, the fans 200 of the bank 700 are all operational. Accordingly, the fan blades 205,206,207 have been transitioned to the axially displaced open position 300 by the actuator. In one or more embodiments, this transition occurs automatically when the spindle 203 of each fan 200 begins rotating, or alternatively rotates above a predefined rotational velocity or a predefined number of revolutions per minute as described above. Since all of the fan blades 205,206,207 have transitioned to the axially displaced open position 300, each fan blade 205,206,207 draws air 211 through the duct 202 of the housing 201 when the spindle 203 rotates.

To understand the recirculation problem, consider the situation in which the center fan failed. If the fan blades 205,206,207 remained in the axially displaced open position 300, rotation of the spindles 203 of the two adjacent fans can cause an airflow draw that is so strong that recirculated air 701 can be drawn out of the center fan 200 and then back into the exterior fans 200. Thus, in certain circumstances, neighboring fans can actually draw warm air out of the housing to which the bank 700 is coupled through a prior art failed fan and then recirculate it back into the housing itself.

Embodiments of the disclosure preclude this by automatically transitioning the fan blades 205,206,207 from the axially displaced open position 300 to the closed position (400) when the spindle 203 ceases rotation. Turning now to FIG. 8, this has happened with the central fan 200.

Since the central fan 200 has failed, the fan blades 205,206,207 have automatically transitioned to the closed position 400. In one or more embodiments, this restricts airflow through the duct 202. Since airflow through the duct 202 is restricted or precluded, it cannot be recirculated through the neighboring fans. Thus, the recirculation problem is solved. Moreover, it is solved without adding any external components, be they louvers, flaps, or wings, to the fans.

Figure 9:
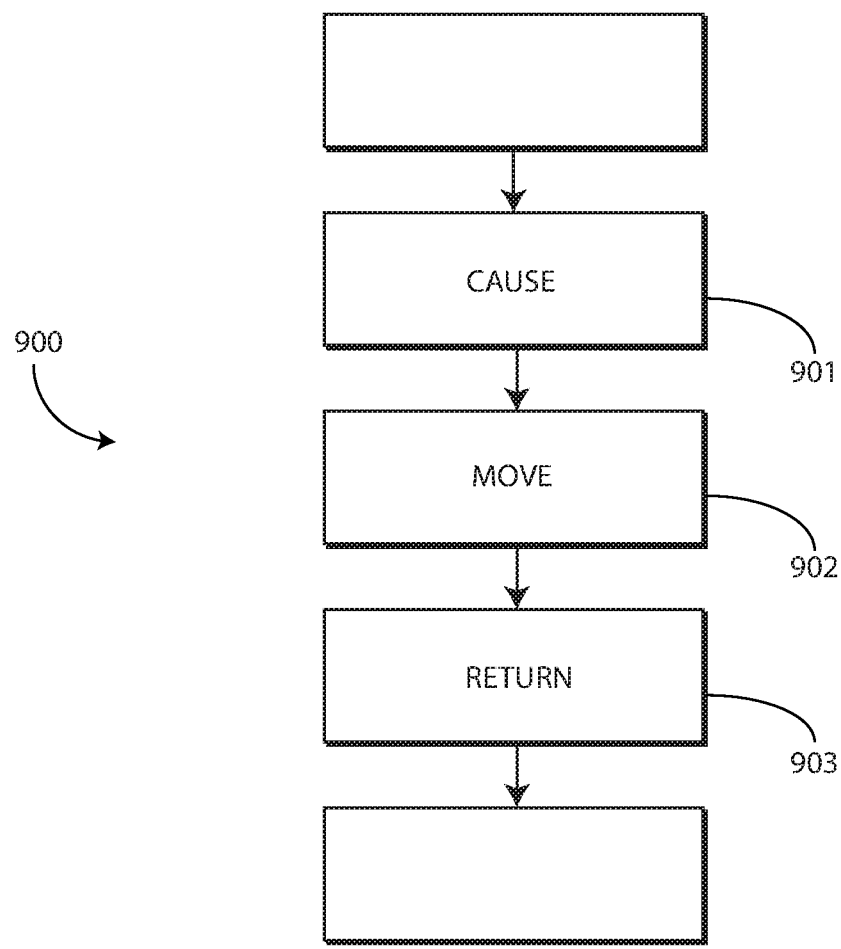
FIG. 9 illustrates one explanatory embodiment of a method in accordance with one or more embodiments of the disclosure.

Turning now to FIG. 9, illustrated therein is one explanatory method 900 for a fan in accordance with one or more embodiments of the disclosure. While the method 900 of FIG. 9 is primarily intended for use with fans, it should be noted that it can be used with other air components, including air movers, blowers, or other devices are employed to draw air into, or remove air from, the housing of a device.

At step 901, the method 900 includes causing a spindle of the fan, which is situated within a duct in one or more embodiments, to rotate. In one or more embodiments, rotation of the spindle causes one or more blades extending radially from the spindle to automatically pivot about a radial axis from a closed position restricting airflow through the duct to an axially displaced open position drawing air through the duct.

At step 902, the method 900 optionally includes moving a lever coupled to each fan blade from a first position to a radially displaced second position to cause the each fan blade to pivot about the radial axis from the closed position restricting airflow through the duct to the axially displaced open position drawing air through the duct. In other embodiments, step 902 can include using inertia from a weighted lever, a motor, or other mechanism to cause the each fan blade to pivot about the radial axis from the closed position restricting airflow through the duct to the axially displaced open position drawing air through the duct.

At step 903, the method 900 further comprises automatically returning the one or more blades to the closed position when the spindle ceases rotating. Step 903 occurs, in one or more embodiments, when the fan fails. However, it can also occur when the fan is turned OFF normally.

Figure 10:
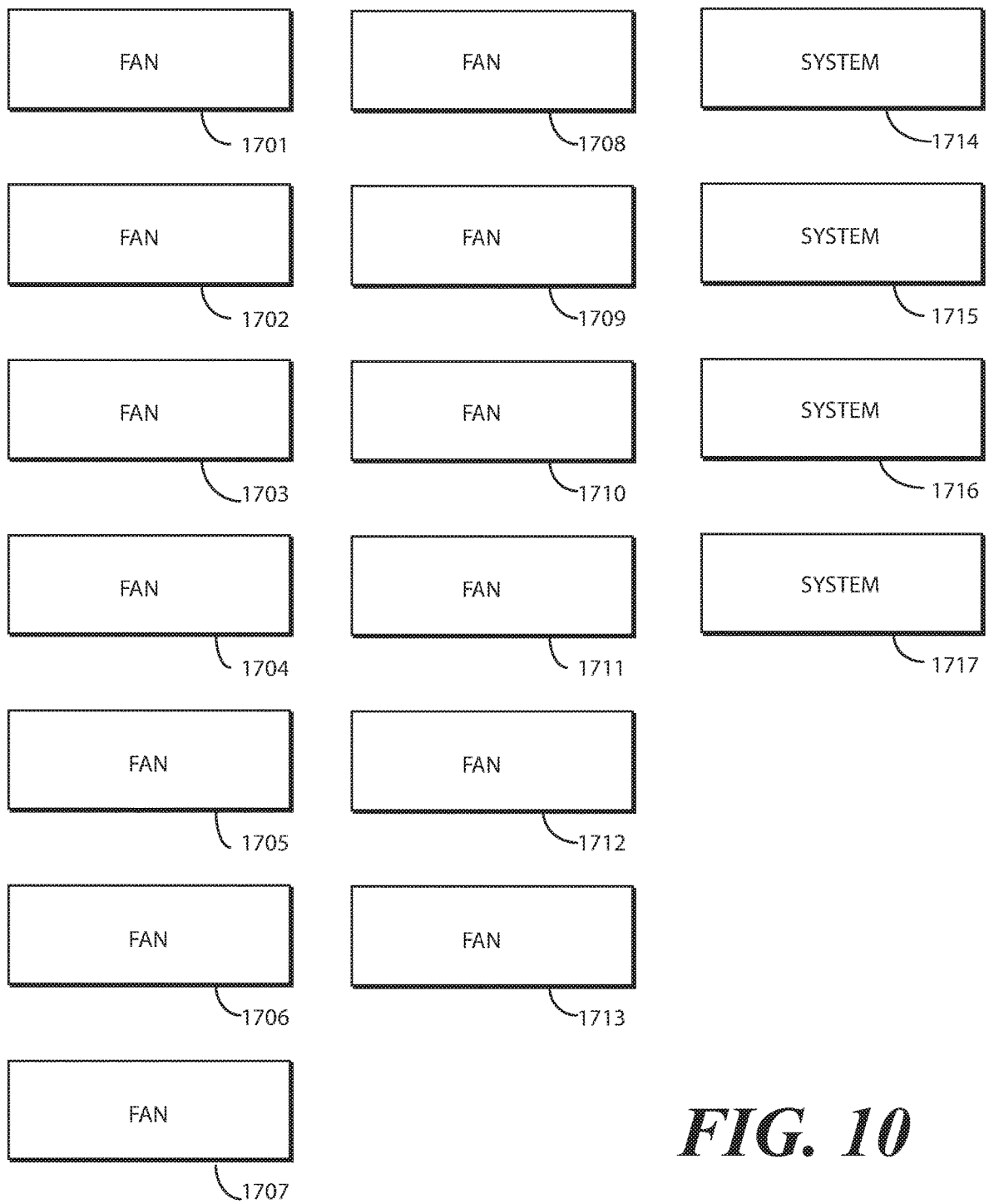
FIG. 10 illustrates one or more embodiments of the disclosure.

Turning now to FIG. 10, illustrated therein are various embodiments of the disclosure. At 1001, a fan comprises a housing defining a duct. At 1001, the fan comprises a spindle concentrically located about a central axis within the duct. At 1001, the fan comprises one or more fan blades extending radially from the spindle toward a surface of the duct. At 1001, each fan blade is pivotable about a radial axis extending distally from the surface of the spindle between a closed position where the each fan blade is in contact with each adjacent fan blade and an axially displaced open position where the each fan blade is physically separated from the each adjacent fan blade.

At 1002, each fan blade of 1001 draws air through the duct when the spindle rotates and the each fan blade is in the axially displaced open position. At 1003, each fan blade of 1002 restricts airflow through the duct when in the closed position.

At 1004, the fan of 1001 further comprises one or more actuators operable to automatically transition the each fan blade from the axially displaced open position to the closed position when the spindle stops rotating. At 1005, the one or more actuators of 1004 comprise one or more motors. At 1005, the one or more actuators of 1004 comprise one or more springs, each spring applying a loading force on the each fan blade to bias the each fan blade toward the closed position.

At 1007, each fan blade of 1006 comprises a shaft and a paddle. At 1007, each spring is positioned about the shaft and biasing the paddle toward the closed position. At 1008, each fan blade of 1007 further comprises a lever coupled to the shaft opposite the paddle. At 1009, the lever of 1008 comprises a weight wherein inertia of the weight transitions each fan blade from the closed position to the axially displaced open position when the spindle exceeds a predefined rotational velocity.

At 1010, the fan of 1008 further comprises a driver concentrically located within the spindle. At 1011, the driver of 1010 comprises one or more actuation arms. At 1011, rotation of the driver causes each actuation arm to radially displace the lever, thereby transitioning the each blade to the axially displaced open position.

At 1012, the fan of 1011 further comprises a rib limiting radial displacement of the lever when the spindle exceeds a predefined rotational velocity. At 1013, the radial displacement of 1012 is limited to about forty-five degrees about the radial axis.

At 1014, an electronics cooling system comprises a chassis. At 1014, the electronics cooling system comprises a plurality of fans coupled to a sidewall of the chassis. At 1014, each fan comprises a housing defining a duct, a spindle centrally located within the duct, and one or more fan blades extending radially from the spindle toward a surface of the duct. At 1014, each fan blade is pivotable about a radial axis between a closed position restricting airflow through the duct and an axially displaced open position drawing air through the duct when the spindle rotates.

At 1015, the one or more fan blades of 1014 automatically transition from the axially displaced open position to the closed position when the spindle ceases rotation. At 1016, the one or more fan blades of 1015 automatically transition to the axially displaced open position when the spindle exceeds a predefined number of revolutions per minute. At 1017, the fan of 1015 further comprises a driver situated within the spindle. At 1017, the driver automatically transitions the one or more fan blades to the axially displaced open position when the driver rotates.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A fan, comprising:
   a housing defining a duct;
   a spindle concentrically located about a central axis within the duct;
   one or more fan blades extending radially from the spindle toward a surface of the duct;
   wherein each fan blade is pivotable about a radial axis between a closed position where the each fan blade is in contact with each adjacent fan blade and an axially displaced open position where the each fan blade is physically separated from the each adjacent fan blade;
   one or more actuators operable to automatically transition the each fan blade from the axially displaced open position to the closed position when the spindle stops rotating;
   a driver concentrically located within the spindle, such that the spindle rotates around the driver, the driver comprising one or more actuation arms, wherein rotation of the driver causes each actuation arm to radially displace a lever, thereby transitioning the each blade to the axially displaced open position.

2. The fan of claim 1, wherein the each fan blade draws air through the duct when the spindle rotates and the each fan blade is in the axially displaced open position.

3. The fan of claim 2, wherein the each fan blade restricts airflow through the duct when in the closed position.

4. The fan of claim 1, the one or more actuators comprising one or more springs, each spring applying a loading force on the each fan blade to bias the each fan blade toward the closed position.

5. The fan of claim 4, the each fan blade comprising a shaft and a paddle, the each spring positioned about the shaft and biasing the paddle toward the closed position.

6. The fan of claim 5, the each fan blade further comprising the lever coupled to the shaft opposite the paddle.

7. The fan of claim 6, the lever comprising a weight wherein inertia of the weight transitions the each fan blade from the closed position to the axially displaced open position when the spindle exceeds a predefined rotational velocity.

8. The fan of claim 1, further comprising a rib limiting radial displacement of the lever when the spindle exceeds a predefined rotational velocity.

9. The fan of claim 8, wherein a radial displacement is limited to about forty-five degrees about the radial axis.

10. An electronics cooling system, comprising:
   a chassis;
   a plurality of fans coupled to a sidewall of the chassis;
   wherein each fan comprises:
      a housing defining a duct;
      a spindle centrally located within the duct; and
      one or more fan blades extending radially from the spindle toward a surface of the duct and pivotable about a radial axis between a closed position restricting airflow through the duct and an axially displaced open position drawing air through the duct when the spindle rotates;
   wherein each of the one or more fan blades automatically transitions from the axially displaced open position to the closed position when the spindle ceases rotation; and
   a driver situated concentrically within the spindle, such that the spindle rotates around the driver, the driver automatically transitioning the one or more fan blades to the axially displaced open position when the driver rotates, the driver comprising one or more actuation arms, wherein rotation of the driver causes each actuation arm to radially displace a lever, thereby transitioning the each blade to the axially displaced open position.

11. The electronics cooling system of claim 10, wherein the each of the one or more fan blades automatically transitions to the axially displaced open position when the spindle exceeds a predefined number of revolutions per minute.

12. A method for a fan, the method comprising:
   causing a spindle of the fan, situated within a duct, to rotate, thereby causing one or more blades extending radially from the spindle to automatically pivot about a radial axis from a closed position restricting airflow through the duct to an axially displaced open position drawing air through the duct;
   automatically returning the one or more blades to the closed position when the spindle ceases rotating;
   providing a driver concentrically located within the spindle, such that the spindle rotates around the driver, the driver comprising one or more actuation arms, wherein rotation of the driver causes each actuation arm to radially displace a lever coupled to each fan blade from a first position to a radially displaced second position to cause the each fan blade to pivot about the radial axis from the closed position restricting airflow through the duct to the axially displaced open position drawing air through the duct.

* * * * *